(12) United States Patent
Franke

(10) Patent No.: US 8,427,031 B2
(45) Date of Patent: Apr. 23, 2013

(54) DRIVE ELEMENT AND METHOD FOR OPERATING A DRIVE ELEMENT

(75) Inventor: Axel Franke, Ditzingen (DE)

(73) Assignee: Robert Bosch GmbH, Stuttgart (DE)

( * ) Notice: Subject to any disclaimer, the term of this patent is extended or adjusted under 35 U.S.C. 154(b) by 688 days.

(21) Appl. No.: 12/645,120

(22) Filed: Dec. 22, 2009

(65) Prior Publication Data

US 2010/0225255 A1 Sep. 9, 2010

(30) Foreign Application Priority Data

Mar. 6, 2009 (DE) .......................... 10 2009 001 381

(51) Int. Cl.
  *H02N 1/00* (2006.01)
(52) U.S. Cl.
  USPC ........................................................ 310/309
(58) Field of Classification Search ................. 310/309; 318/116; 322/2 A
  See application file for complete search history.

(56) References Cited

U.S. PATENT DOCUMENTS

| | | | |
|---|---|---|---|
| 6,178,069 B1 * | 1/2001 | Suzuki | 360/294.5 |
| 6,771,001 B2 * | 8/2004 | Mao et al. | 310/309 |
| 6,961,257 B2 * | 11/2005 | Garverick et al. | 365/49.1 |
| 7,990,233 B2 * | 8/2011 | Suzuki | 333/186 |

FOREIGN PATENT DOCUMENTS

DE 198 08 549 9/1999

* cited by examiner

*Primary Examiner* — Tran Nguyen
*Assistant Examiner* — Thomas Truong
(74) *Attorney, Agent, or Firm* — Kenyon & Kenyon LLP

(57) ABSTRACT

A drive element is provided having a substrate, a seismic mass, a drive electrode and a counter-electrode, one of the two electrodes being connected to the substrate and the other of the two electrodes being connected to the seismic mass; and the drive electrode and the counter-electrodes being provided for the excitation of motion of the seismic mass in a main direction of motion; and in addition, the drive electrode includes a first and a second partial electrode, which are switchable separately from each other.

12 Claims, 2 Drawing Sheets

(State of the Art)

DRIVE ELEMENT AND METHOD FOR OPERATING A DRIVE ELEMENT

BACKGROUND INFORMATION

Sensor systems are generally known. For example, a drive element is known from German Patent No. DE 198 08 549, a drive electrode and a counter-electrode being developed as intermeshing comb structures. A seismic mass is driven capacitively, using the drive electrode and the counter-electrode, the drive element, in particular, being wired up with square-wave voltages, which are applied to the drive electrode at an alternating frequency matched to the natural frequency of the sensor, and is converted there also to square-wave force pulses. However, the square-wave pulses which are applied to such a micromechanical pattern, include not only the desired natural frequency, but also higher frequency components. Even if the micromechanical pattern has a low-pass response because of its design, the higher frequency components contained in the drive signal may impinge on the additional mechanical modes of the complex pattern and likewise get these interfering modes to oscillate. In order to avoid this, drive forces may be developed as a continuous signal (for instance, as a sine signal). The generation of a correspondingly suitable drive voltage requires a considerable expenditure for circuitry, such as a digital signal generation together with a digital-to-analog converter or an analog signal generation, in each case having a comparatively high resolution.

SUMMARY OF THE INVENTION

The drive element according to the present invention and the method according to the present invention, for operating a drive element, have the advantage that the abovementioned disadvantages of the related art are essentially removed, and thus the occurrence of interfering modes is considerably reduced. This is achieved in that, based on the division of the drive electrode into the first and second partial electrodes which are particularly connected sequentially, a quasi-continuous drive force is generated between the drive electrode and the counter-electrode, using a comparatively low additional expenditure. In particular, no digital-analog converter or analog signal generating are required for this. Rather, in an advantageous manner, using a simple digital or square-wave drive signal continues to be used for controlling the drive electrode. On the one hand, the drive force is a square function of the applied voltage difference between the drive voltage and the voltage of the counter-electrode, and on the other hand, it is a function of the electrical capacitance between the drive electrode and the counter-electrode. Thus, the conversion of the digital drive signal to a quasi-continuous drive force takes place directly by the appropriate connecting or disconnecting of the second or additional partial electrodes to the first partial electrode. In this case, the drive voltage remains constant, but the electrical capacitance is successively increased or decreased by the sequential connecting or disconnecting of additional partial electrodes. Controlling the sequential connecting or disconnecting, in this instance, is possible, for example, by control elements, such as a simple multiplexer, the digital drive signal being particularly used for controlling the control elements. Consequently, the digital control signal is particularly advantageously used both for generating the drive force and for connecting and disconnecting the individual partial electrodes. The drive element preferably includes a micromechanical pattern, and is especially preferably a part of a micromechanical rotation rate sensor, a micromechanical mirror and/or a micromechanical resonator. Furthermore, the drive element according to the present invention, in comparison with the related art, requires no additional wafer area, and may particularly well be implemented in the case of monolithic integration of circuit and drive pattern, because of the increased number of electrical connections.

According to one preferred refinement, it is provided that the drive electrode includes additional partial electrodes, which are switchable separately from the first and/or the second partial electrode. In a particularly advantageous manner, the curve of the drive force becomes increasingly more continuous with an increasing number of additional partial electrodes, since the respectively connected partial forces become ever smaller, in this case. The occurrence of interfering modes thereby advantageously also becomes ever smaller with an increasing number of partial electrodes. Because of an appropriate subdivision of the overall capacitance between the drive electrode and the counter-electrode to an appropriate number of partial electrodes, a desired quantization of the overall capacitance is achieved, whereby the desired fineness in the gradation of the drive force is achieved. The first, the second and/or the additional partial electrodes are preferably designed as finger electrodes, which, in common, mesh with a counter-electrode developed as a comb structure. The meshing depth, in this instance, is a function of the motion of the seismic mass along the main direction of motion, which is aligned, in particular, in parallel to the main direction of extension of the finger electrodes. As an alternative, it is also conceivable to implement the drive element according to the present invention having planar electrodes, only the distance between the planar electrodes being changed, and no intermeshing of the finger electrodes taking place.

According to another preferred refinement, it is provided that the first, the second and/or the additional partial electrodes have a different number of electrode fingers. Consequently, the first, the second and additional partial electrodes particularly advantageously make different contributions to the drive force, so that, in response to the connection of the second and/or additional partial electrodes, the respective additional contribution to the drive force becomes ever smaller, so that the entire curve of the drive force plotted against time has as continuous a curve as possible.

According to another preferred refinement, it is provided that the electrode fingers of the first, the second and/or the additional partial electrodes have a different width, thickness and/or length. It is therefore of particular advantage to achieve a different contribution of the respective drive forces of the first, the second and/or the additional partial electrodes, without having to implement a different number of finger electrodes between the first, the second and/or the additional partial electrodes. Alternatively, the effect of the different contributions to the drive force is able to be reinforced by a combination of different numbers of finger electrodes and a different width, thickness and/or length of the finger electrodes.

According to another preferred refinement, it is provided that the first, the second and/or the additional partial electrodes have a different geometric shape. Alternatively or in addition, it is also particularly advantageously possible to achieve different contributions of the drive force of the first, the second and/or of additional partial electrodes by an appropriate geometric formation of the corresponding partial electrode or of the finger electrodes of the corresponding partial electrode.

According to another preferred refinement, it is provided that the first, the second and/or the additional partial electrodes have a different distance from the counter-electrode. Alternatively or in addition, it is also particularly advantageously implementable to achieve different contributions of the drive force of the first, the second and/or of additional partial electrodes by a respectively different distance from the counter-electrodes or from the corresponding finger electrodes of the counter-electrode.

According to another preferred refinement, it is provided that the first, the second and/or the additional partial electrodes are developed in such a way that a first drive force generated by the first partial electrode is essentially twice as big as a second drive force generated by the second partial electrode and/or that a second drive force generated by the second partial electrode is essentially twice as big as an additional drive force generated by the additional partial electrode. It is particularly advantageously provided in this connection that the different distance, the different geometric shaping and/or the different number of finger electrodes are selected in such a way that each partial electrode generates a drive force increased respectively by a factor of two over, for instance, what the adjacent partial electrode does. Thus, for instance, the first partial electrode generates twice as large a drive force as the second partial electrode, and the second partial electrode generates twice as large a second drive force as the additional partial electrode. This has the advantage that the partial electrodes are to be connected using a binary signal. Consequently, this makes possible the stepwise connecting or disconnecting of the partial electrodes, each drive force advantageously being represented within the scope of the smallest quantization unit (LSB). In the case of the first, the second and/or the additional partial electrodes, the smallest drive force is generated using binary value 001, for example, since the additional partial electrode is now connected. The next higher binary value 010 would lead to the connection only of the second partial electrode, the subsequent greater binary value 011 generating a connection both of the second and the additional partial electrode. This makes possible a fine gradation of the drive force by binary numbers up to the greatest drive force possible, having binary value 111, in this case, the first, the second and the additional partial electrodes being connected. In the case of planar electrodes, the gradation of the drive force is preferably achieved by a suitable selection of the respective length of the partial electrodes and/or the respective distances between the partial electrodes and the counter-electrode.

According to an additional preferred refinement, it is provided that the drive electrodes have a symmetrical situation of the first, the second and/or the additional partial electrodes. Consequently, a resulting torque acting on the seismic mass by the sequential connecting of the first, the second and/or the additional partial electrodes is advantageously prevented. The first, the second and/or the additional partial electrodes are preferably developed for this in mirror symmetry to a mirror plane, the mirror plane especially preferably running parallel to the main direction of motion, parallel to the substrate and centrically through the drive electrode and/or the detection electrode.

A further subject matter of the present invention is a method for operating a drive element using a drive electrode and a counter-electrode, one of the two electrodes being connected to a substrate and the other of the two electrodes being connected to a seismic mass, and in a first method step, for exciting the motion of the seismic mass in a main direction of motion, a first partial electrode of the drive electrode being connected, and, in a subsequent second method step, for the excitation of motion of the seismic mass in the main direction of motion, a second partial electrode of the drive electrode being connected. In a particularly preferred way, the method according to the present invention thus makes possible the generation of a quasi-continuous drive force based on a digital drive signal, without having to use a complex circuit expenditure and especially a digital analog-digital converter. As was stated in detail above, this has the result that the occurrence of interfering modes is greatly suppressed.

According to one preferred refinement, it is provided that, in additional method steps, especially sequentially speaking, additional partial electrodes of the drive electrode are connected for the excitation of motion of the seismic mass in the main direction of motion. In an advantageous manner, the increase in the number of partial electrodes leads to an increase in the adjustment of the drive force to a continuous curve, so that the undesired interfering modes are further reduced.

According to another preferred refinement, it is provided that, in the first method step, in the second method step and/or in additional method steps, a drive signal is applied to the first, the second and/or the additional partial electrodes, particularly the connection of the first, the second and/or the additional partial electrodes being carried out by the drive signal. In an especially advantageous manner, the drive signal is thus used simultaneously for generating the drive force and for connecting the individual partial electrodes. The circuit expenditure for generating the drive signal thus remains unchanged, particularly as compared to the related art.

According to another preferred refinement, it is provided that the first, the second and/or the additional partial electrodes are connected using a binary signal. Consequently, in a particularly preferred manner, as was set forth above, the generation of any desired drive force is possible, while taking into account the smallest quantization unit (LSB).

DETAILED DESCRIPTION

Figure 1:
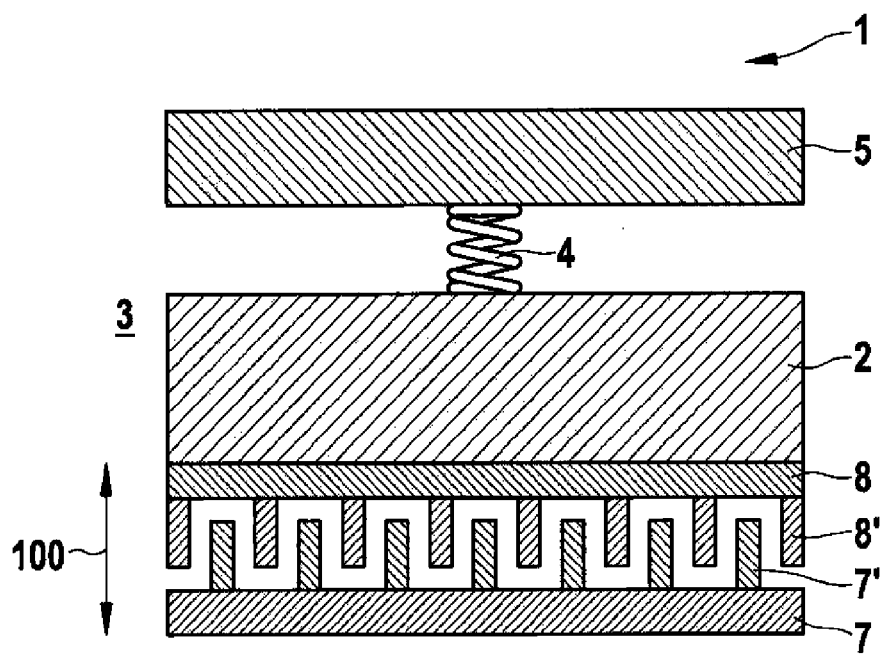
FIG. 1 shows a schematic plan view of a drive element according to the related art.

FIG. 1 shows a schematic plan view of a drive element 1 according to the related art, drive element 1 having a substrate 3 and a seismic mass 2. Seismic mass 2 is fastened to a retaining element 5 using a spring element 4 on substrate 3, so that seismic mass 2 is movable at least parallel to a main direction of motion 100 in relation to substrate 3. A stationary drive electrode 7 is situated on substrate 3, which is provided for the interaction with a counter-electrode 8 fastened to seismic mass 2. Counter-electrode 8 includes a plurality of counter-finger electrodes 8' in this context and drive electrode 7 analogously includes a plurality of drive finger electrodes 7'. Counter-finger electrodes 8' and drive finger electrodes 7' are aligned essentially parallel to one another with respect to their main direction of extension, and parallel to main direction of motion 100, being situated parallel to substrate 3 and perpendicular to main direction of motion 100, offset to one another, so that drive electrode 7 and counter-electrode 8 include intermeshing comb structures. When a square-wave voltage is applied to drive electrode 7 as a drive voltage, a clock pulse-wise electrostatic force effect is produced between drive electrode 7 and counter-electrode 8, which leads to an excitation of motion of seismic mass 2 with respect to substrate 3. The square-wave pulses acting on seismic mass 2 because of the square-wave voltage, in this instance, have higher frequency components, which produce undesired interfering modes in the drive pattern.

Figure 2:
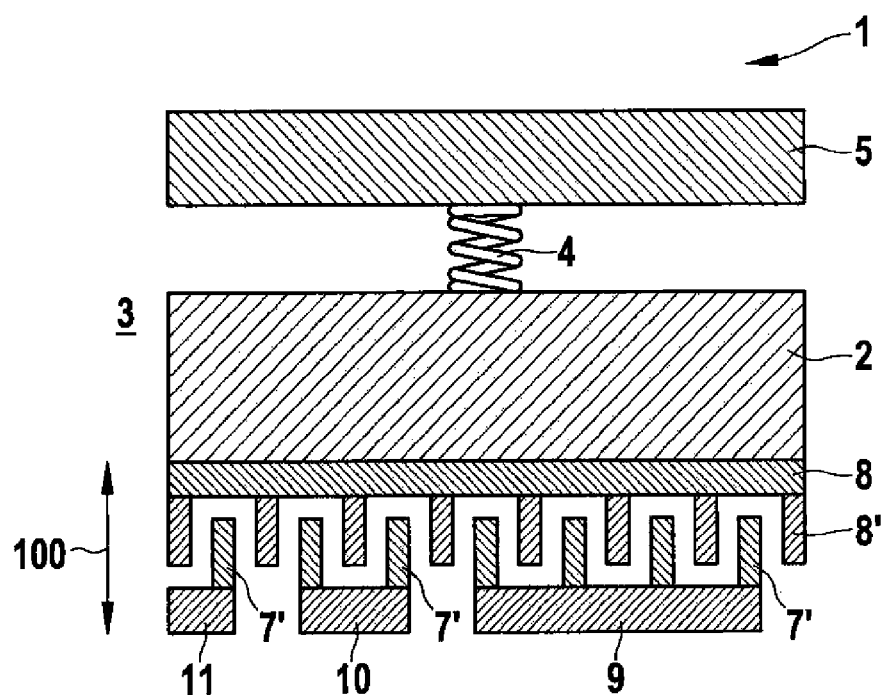
FIG. 2 shows a schematic plan view of a drive element according to an exemplary specific embodiment of the present invention.

FIG. 2 shows a schematic plan view of a drive element 1 according to an exemplary embodiment of the present invention, drive element 1 according to the present invention being essentially similar to the drive element shown in FIG. 1, drive electrode 7 being subdivided into a first, a second and an additional partial electrode 9, 10, 11; the first, the second and the additional partial electrode 9, 10, 11 not being directly connected to one another electrically conductively. For the control of drive electrode 7, as in the drive element shown in FIG. 1, a digital square-wave voltage is used, entire drive electrode 7 not being connected in one go, but the first, the second and the additional partial electrode being connected sequentially. The electric capacitance between drive electrode 7 and counter-electrode 8 thus also increases sequentially, so that the drive force acting upon counter-electrode 8 is not generated abruptly and having the high-frequency components resulting therefrom, but rises quasi-continuously in three method steps. In the first method step, in this instance, first electrode 9, in the second method step, second electrode 10, and in the additional method step, additional electrode 11 are connected. Analogously, disconnecting the drive force is produced by the sequential disconnecting of the first, the second and the additional partial electrodes 9, 10, 11. In this instance, the first, the second and/or the additional partial electrode 9, 10, 11 include a different number of electrode fingers 7', first partial electrode 9 having four electrode fingers 7', second partial electrode 10 having two electrode fingers 7' and additional partial electrode 11 having one electrode finger 7'. The contribution of the first, the second and/or the additional partial electrode 9, 10, 11 to the drive force is consequently of different sizes, so that a curve over time of the drive force, that is as continuous as possible, becomes implementable. Alternatively, a symmetrical arrangement, not illustrated, of the first, the second and the third partial electrodes 9, 10, 11 is conceivable, so that no resulting torque acts upon seismic mass 2. First, second and additional partial electrodes 9, 10, 11 are controlled, in particular, using a binary signal, for this first, second and additional partial electrodes 9, 10, 11 being developed in such a way that the first and second drive force generated by first and second partial electrode 9 is twice as great as the second and additional drive force generated by the second and additional partial electrode 10.

Figure 3:
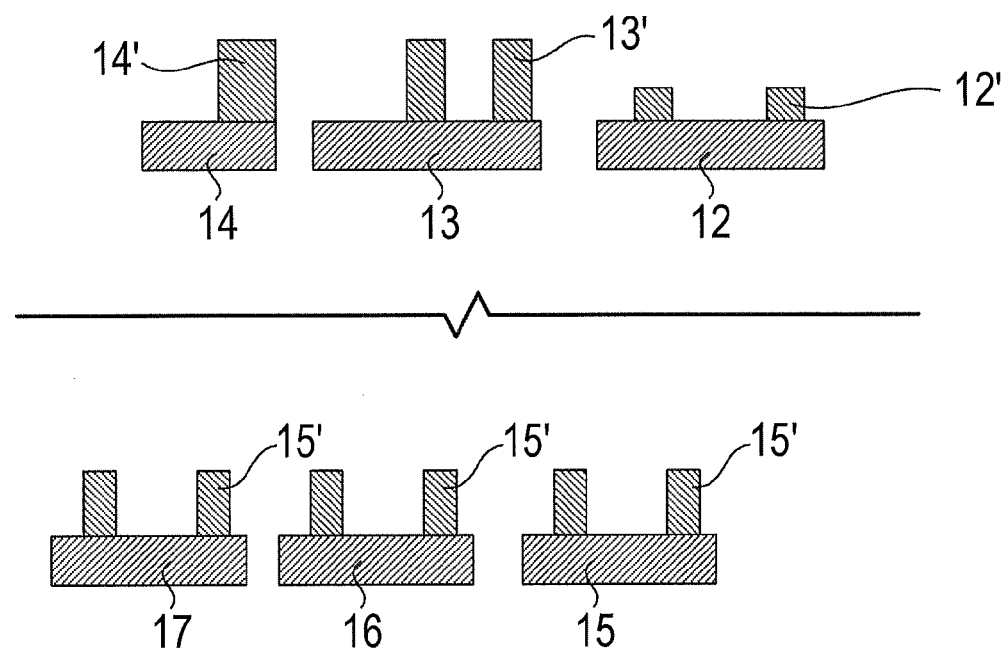
FIG. 3 shows additional schematic plan views of electrode fingers and partial electrodes according to additional exemplary embodiments of the present invention.

FIG. 3 shows additional exemplary embodiments of different electrode fingers 12', 13', 14', and 15' and partial electrodes 12, 13, 14, 15, 16, and 17 according to additional exemplary embodiments of the present invention. In an embodiment, one or more of the electrode fingers 12', 13', and 14' of the first, the second and/or the additional partial electrodes 12, 13, and 14 may have a different width, thickness and/or length. Electrodes, such as electrodes 12' and 13' may also be at a different distance from the counter-electrode 8'. An embodiment may have a symmetrical arrangement of the first, the second, and/or the additional partial electrodes 15, 16, 17.

What is claimed is:

1. A drive element comprising:
    a substrate;
    a seismic mass;
    a drive electrode including a first partial electrode and a second partial electrode which are switchable separately from each other to generate different drive forces and which are connected in a stepwise manner using a binary signal with each of the different drive forces represented within a scope of a smallest quantization unit of the binary signal; and
    a counter-electrode,
    wherein one of the drive electrode and the counter-electrode is connected to the substrate and the other of the drive electrode and the counter-electrode is connected to the seismic mass, and
    wherein the drive electrode and the counter-electrode are provided for an excitation of motion of the seismic mass in a main direction of motion.

2. The drive element according to claim 1, wherein the drive electrode includes additional partial electrodes, which are switchable separately from at least one of the first and second partial electrodes.

3. The drive element according to claim 2, wherein the first, the second and/or the additional partial electrodes have a different number of electrode fingers.

4. The drive element according to claim 3, wherein the electrode fingers of the first, the second and/or the additional partial electrodes have a different width, thickness and/or length.

5. The drive element according to claim 2, wherein the first, the second and/or the additional partial electrodes have a different geometric shape.

6. The drive element according to claim 2, wherein the first, the second and/or the additional partial electrodes are at a different distance from the counter-electrode.

7. The drive element according to claim 2, wherein the first, the second and/or the additional partial electrodes are developed in such a way that at least one of (a) a first drive force generated by the first partial electrode is about twice as large as a second drive force generated by the second partial electrode and (b) a second drive force generated by the second partial electrode is about twice as large as an additional drive force generated by the additional partial electrode.

8. The drive element according to claim 2, wherein the drive electrode has a symmetrical arrangement of the first, the second and/or the additional partial electrodes.

9. A method for operating a drive element having a drive electrode and a counter-electrode, one of the drive electrode and the counter-electrode being connected to a substrate and the other of the drive electrode and the counter-electrode being connected to a seismic mass, the method comprising:
    in a first method step, for exciting a motion of the seismic mass in a main direction of motion, connecting a first partial electrode of the drive electrode;
    in a second method step, for exciting the motion of the seismic mass in the main direction of motion, connecting a second partial electrode of the drive electrode; and
    switchable connecting the first and the second partial electrodes using a binary signal to generate different drive forces, each drive force represented within a scope of a smallest quantization unit of the binary signal.

10. The method according to claim 9, further comprising, in additional sequential method steps, connecting additional partial electrodes of the drive electrode for exciting the motion of the seismic mass in the main direction of motion.

11. The method according to claim 10, wherein, in the first method step, in the second method step and/or in the additional method steps, a drive signal is applied to the first, the second and/or the additional partial electrodes, the connection of the first, the second and/or the additional partial electrodes being carried out by the drive signal.

12. The method according to claim 10, wherein the first, the second and/or the additional partial electrodes are connected using the binary signal.

\* \* \* \* \*